(12) United States Patent
Kuwana et al.

(10) Patent No.: US 7,342,407 B2
(45) Date of Patent: Mar. 11, 2008

(54) TEMPERATURE COMPENSATION CIRCUIT AND TESTING APPARATUS

(75) Inventors: Yuji Kuwana, Tokyo (JP); Yoshiharu Umemura, Tokyo (JP); Takashi Sekino, Tokyo (JP)

(73) Assignee: Advantest Corporation, Tokyo (JP)

( * ) Notice: Subject to any disclaimer, the term of this patent is extended or adjusted under 35 U.S.C. 154(b) by 72 days.

(21) Appl. No.: 11/343,900

(22) Filed: Jan. 31, 2006

(65) Prior Publication Data
US 2007/0176617 A1   Aug. 2, 2007

(51) Int. Cl.
 *G01R 31/26* (2006.01)
 *G06F 11/00* (2006.01)
 *H03K 17/14* (2006.01)

(52) U.S. Cl. ........................ 324/765; 714/738; 327/378

(58) Field of Classification Search ................ 324/760, 324/178, 765; 327/378, 513; 374/133, 169, 374/172, 182; 714/738
See application file for complete search history.

(56) References Cited

U.S. PATENT DOCUMENTS

| | | | |
|---|---|---|---|
| 4,727,269 A | * | 2/1988 | Luich ........................ 327/51 |
| 5,376,846 A | * | 12/1994 | Houston ..................... 327/513 |
| 5,973,542 A | | 10/1999 | Okayasu et al. |
| 6,094,085 A | | 7/2000 | Okayasu et al. |
| 6,097,179 A | * | 8/2000 | Ray et al. ................... 323/312 |
| 6,104,232 A | | 8/2000 | Filip et al. |
| 6,484,117 B1 | * | 11/2002 | Wohlfarth .................. 702/132 |
| 2003/0222692 A1 | | 12/2003 | Morikawa |
| 2004/0027174 A1 | * | 2/2004 | Ballentin et al. ............. 327/94 |

FOREIGN PATENT DOCUMENTS

| | | |
|---|---|---|
| CN | 03137855.2 | 4/2006 |
| EP | 1 110 319 | 6/2001 |
| EP | 1 378 996 | 1/2004 |
| JP | 9-162721 | 6/1997 |
| JP | 9-246944 | 9/1997 |
| JP | 2000-40366 | 2/2000 |
| JP | 2002-524903 | 8/2002 |
| JP | 2003-347907 | 12/2003 |
| WO | WO-97/33370 | 9/1997 |
| WO | WO-00/13317 | 3/2000 |

OTHER PUBLICATIONS

International Search Report issued in International Application No. PCT/JP2007/050156 mailed on Apr. 10, 2007 and partial English translation thereof, 8 pages.

* cited by examiner

*Primary Examiner*—Ha Tran Nguyen
*Assistant Examiner*—Joshua Benitez
(74) *Attorney, Agent, or Firm*—Osha•Liang LLP

(57) ABSTRACT

A temperature compensation circuit for effectively compensating the difference of a switching timing due to temperature change of a switching element included in a logic circuit is provided. The temperature compensation circuit includes a temperature detecting section for detecting a value corresponding to the temperature of the switching element, and a correction section for correcting the voltage of a logic signal inputted from a previous circuit to the logic circuit in order to reduce the difference of the switching timing due to the temperature change of the switching element based on the value corresponding to the temperature.

7 Claims, 6 Drawing Sheets

US 7,342,407 B2

TEMPERATURE COMPENSATION CIRCUIT AND TESTING APPARATUS

BACKGROUND OF THE INVENTION

1. Field of the Invention

The present invention relates to a temperature compensation circuit and a testing apparatus. Particularly, the present invention relates to a temperature compensation circuit for compensating the difference of a switching timing of a switching element included in a logic circuit.

2. Related Art

Generally, in a logic circuit, the timing of the leading edge or the trailing edge of an output signal is changed because the operating characteristic of the transistor therein when a temperature is correcting the timing of the leading edge and the trailing edge of an input signal has been provided in the previous step, for example, so that the change of timing of the leading edge or the trailing edge of the output signal in the logic circuit has been compensated. However, it is difficult to achieve such method of compensating the change of timing of the leading edge or the trailing edge of the output signal by compensating the change of timing of the edges of the input signal is difficult because the circuit configuration is complicated.

Additionally, the transistor of which calorific value at ON time is larger than that at OFF time. A pair of transistors which operate in the reversed phase each other by the differential logic signal generate the difference of temperature between the transistors each other so that the timing of the leading edge or the trailing edge of the outputted differential logic signal is changed when each ON time is different within a certain time. Therefore, in the logic circuit having a pair of transistors which operate in the reversed phase each other by the differential logic signal, the pair of transistors are come close each other on a pattern in order to reduce the difference of temperature, so that the leading edge or the trailing edge of the output signal has been compensated. However, such method of compensating the output signal by coming close the pair of transistors limits the circuit pattern, so that the circuit size has been enlarged.

SUMMARY OF THE INVENTION

Thus, an object of the present invention is to provide a temperature compensation circuit and a testing apparatus being capable of solving the problem accompanying the conventional art. This object is achieved by combining the features recited in independent claims. Then, dependent claims define further effective specific example of the present invention.

A first aspect of the present invention provides a temperature compensation circuit for compensating the difference of a switching timing due to the temperature change of a switching element included in a logic circuit. The temperature compensation circuit includes a temperature detecting section for detecting a value corresponding to the temperature of the switching element and a correction section for correcting the voltage of a logic signal inputted from a previous circuit to the logic circuit to reduce the difference of the switching timing due to the temperature change of the switching element based on the value corresponding to the temperature.

The logic circuit may be a differential circuit including a first transistor for switching in response to a positive input voltage to change a positive output voltage and a second transistor for switching in response to a negative input voltage to change a negative output voltage. The correction section may correct at least one of the positive input voltage or the negative input voltage based on the value corresponding the temperature.

The temperature detecting section may detect a ratio of ON time of at least one of the first transistor or the second transistor based on the positive input voltage or the negative input voltage and also detect the detected ratio as the value corresponding to the temperature.

The correction section may include a provision section for inputting the differential signal outputted from a previous circuit and differential-switching the differential signal to provide the same to the logic circuit as the positive input voltage and the negative input voltage and an offset adjusting section for adjusting the offset voltage of at least one of the positive input voltage or the negative input voltage provided from the provision section to the logic circuit based on the value corresponding to the temperature.

The temperature detecting section may generate the voltage dependent on the ratio of the time at which at least one of the differential signal pair outputted from the previous circuit is at a high logic level H or a low logic level L and provide the same to the offset adjusting section as the value corresponding to the temperature.

Each switching element may be a transistor. The temperature detecting section may detect a voltage between the PN junction which is adjacent to the PN junction forming a base-emitter junction of the transistor as the value corresponding to the temperature.

The temperature detecting section may detect a value corresponding to the temperature of at least one of switching elements included in any of a plurality of logic circuits connected in series. The correction section may correct the voltage of the logic signal inputted to the front logic circuit in order to reduce the total difference of the switching timing due to the temperature change in the switching element included in each of the plurality of logic circuits connected in series based on the value corresponding to the temperature.

A second aspect of the present invention provides a testing apparatus for testing a device under test. The testing apparatus includes a test signal generating section for generating test signals to be provided to the device under test, a determining section for determining pass/fail of the device under test based on an output signal outputted by the device under test according to the test signal and a temperature compensation circuit for compensating the difference of a switching timing due to the temperature change of a switching element included in a logic circuit in the device under test. The temperature compensation circuit includes a temperature detecting section for detecting the value corresponding to the temperature of the switching element and a correction section for correcting the voltage of a logic signal inputted from a previous circuit to the logic circuit in order to reduce the difference of the switching timing due to the temperature change of the switching element based on the value corresponding to the temperature.

Here, all necessary features of the present invention are not listed in the summary of the invention. The sub-combinations of the features may become the invention.

DETAILED DESCRIPTION OF THE INVENTION

Hereinafter, the present invention will now be described through preferred embodiments. The embodiments do not limit the invention according to claims and all combinations of the features described in the embodiments are not necessarily essential to means for solving the problems of the invention.

Figure 1:
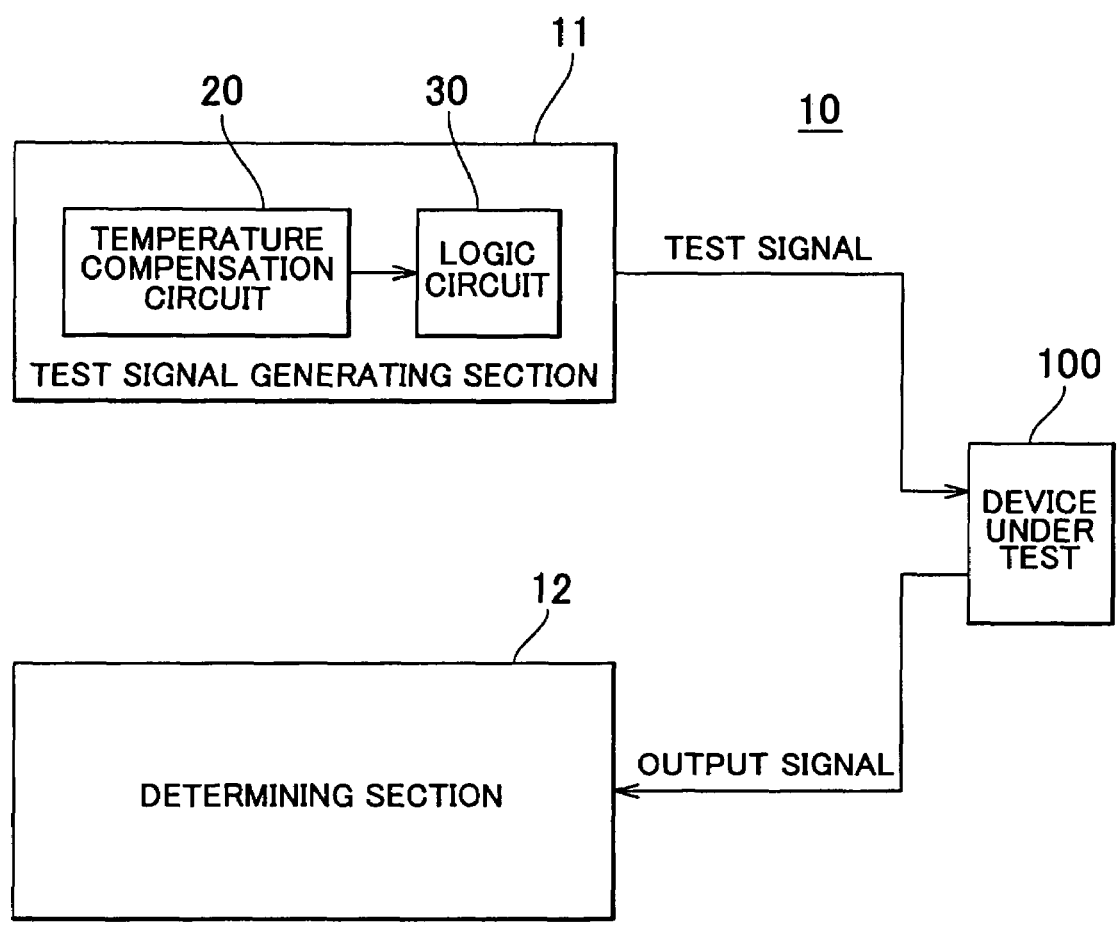
FIG. 1 shows a test apparatus 10 according to an embodiment of the present invention along with a device under test 100.

FIG. 1 shows an example of a test apparatus 10 having a temperature compensation circuit according to the present embodiment along with a device under test 100. The testing apparatus 10 includes a test signal generating section 11 and a determining section 12, and tests the device under test 100. The test signal generating section 11 generates test signals to be provided to the device under test. The determining section 12 determines pass/fail of the device under test 100 based on an output signal outputted from the device under test according to the test signal.

The testing apparatus 10 further includes a temperature compensation circuit 20. The temperature compensation circuit 20 compensates the difference of a switching timing due to the temperature change of a switching element included a logic circuit 30 in the testing apparatus 10. For example, the logic circuit 30 may be a pulse generator or a timing generator included in the test signal generating section 11 or the determining section 12. Here, the testing apparatus 10 may include a plurality of temperature compensation circuits 20 for each of a plurality of logic circuit 30 included in the testing apparatus 10.

Figure 2:
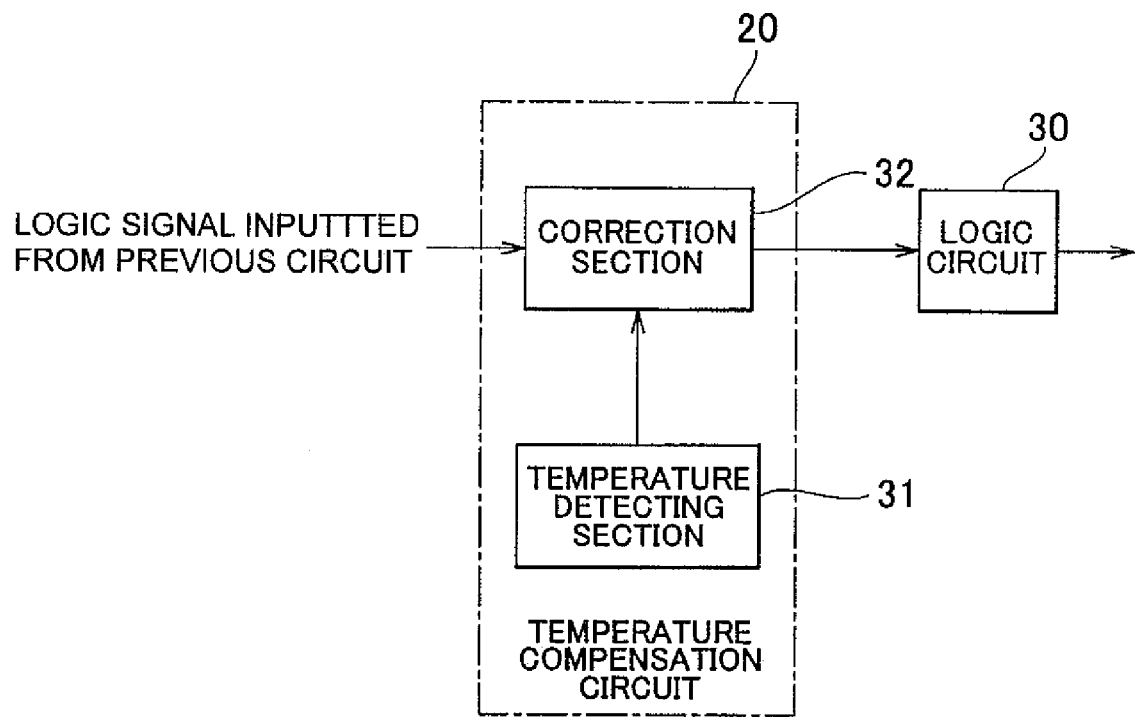
FIG. 2 shows a temperature compensation circuit 20 according to an embodiment of the present invention along with a logic circuit 30.

FIG. 2 shows a temperature compensation circuit 20 according to the present embodiment along with the logic circuit 30. The temperature compensation circuit 20 adjusts the voltage of the logic signal inputted from a previous circuit to the logic circuit 30 to compensate the difference of the switching timing due to the temperature change of the switching element included in the logic circuit 30. Here, the switching element to be compensated switches according to the logic of a logic signal inputted from the previous circuit. For example, the switching element may be a bipolar transistor in which the voltage of the logic signal inputted from the previous circuit is applied between the base and the emitter.

The temperature compensation circuit 20 includes a temperature detecting section 31 and a correction section 32. The temperature detecting section 31 detects a value corresponding to the temperature of the switching element to be compensated in the logic circuit 30. The temperature detecting section 31 may directly detect the temperature of the switching element by a temperature sensor and also may detect any parameter other than a temperature, which fluctuates corresponding to the temperature of the switching element. The correction section 32 corrects the voltage of the logic signal inputted from a previous circuit to the logic circuit 30 in order to reduce the difference of the switching timing due to the temperature change of the switching element to be compensated in the logic circuit 30.

For example, an input voltage (threshold voltage) at which a switching is started is fluctuated according to the temperature in a transistor. Therefore, in the logic circuit 30 having a transistor as the switching element, any jitter is generated in the output signal if the temperature is changed. Accordingly, when the logic circuit 30 has a transistor as the switching element, the correction circuit 32 may adjust to hold the relative threshold voltage to the voltage value of the inputted logic signal constant regardless of the temperature change. Therefore, the correction 32 can correct the voltage of the logic signal inputted from the previous circuit to the logic circuit 30 in order to reduce the difference of the switching timing due to the temperature change of the switching element. Here, the correction section 32 may reduce the difference of the switching timing due to the temperature change of the switching element by increasing or decreasing the voltage of the logic signal inputted from the previous circuit to the logic circuit 30 instead of applying the offset voltage.

As described above, the temperature compensation circuit 20 according to the present embodiment can effectively compensate the difference of the switching timing due to the temperature change of the switching element included in the logic circuit 30. Thereby the temperature compensation circuit 20 according to the present embodiment can reduce jitter of the logic signal which is generated through the logic circuit 30.

Figure 3:
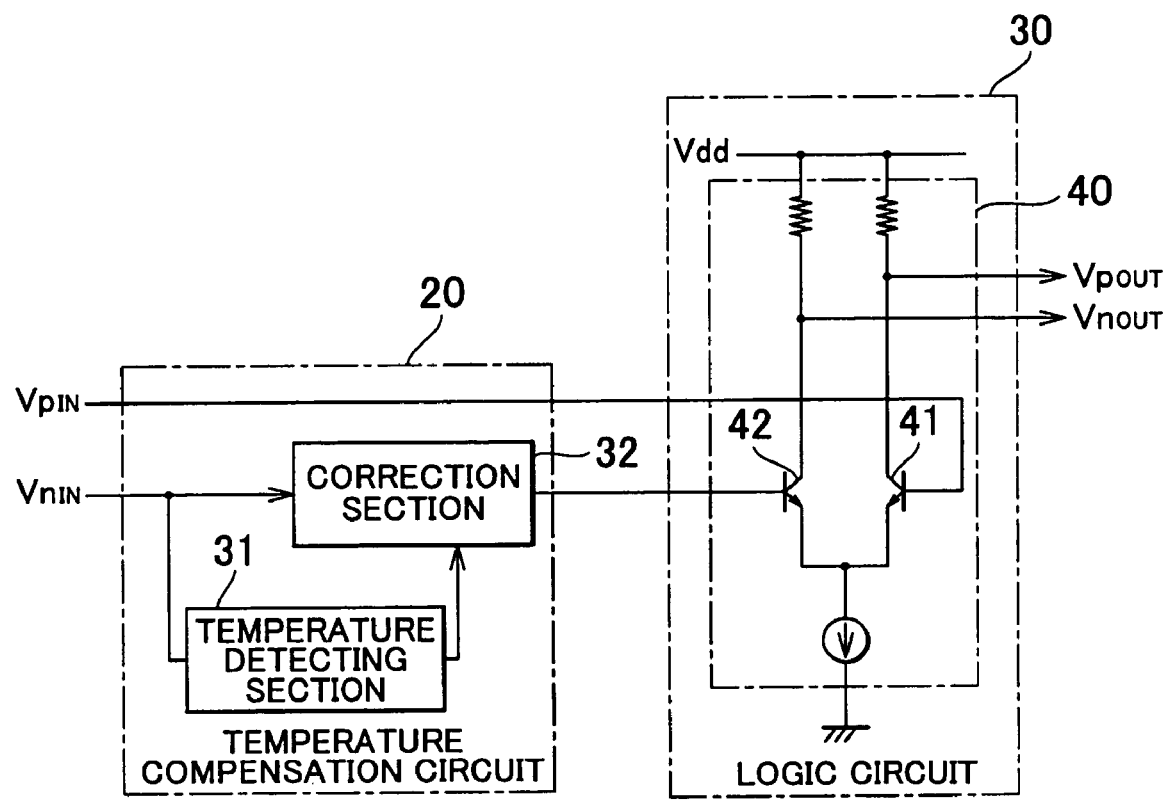
FIG. 3 shows a temperature compensation circuit 20 according to a first embodiment of the present invention along with the logic circuit 30.

FIG. 3 shows a temperature compensation circuit 20 according to a first embodiment along with a logic circuit 30. A temperature compensation circuit 20 according to the present embodiment and the logic circuit 30 to be compensated by the temperature compensation circuit 20 have the function and the configuration substantially same as those of the components with same reference numerals in FIG. 2, so that the description is omitted except for the difference.

The logic circuit 30 may include a differential circuit 40. A differential logic signal (positive input voltage VpIN and negative input voltage VnIN) is inputted from the previous circuit to the differential circuit 40, and then, the differential circuit 40 outputs a differential logic signal (positive output voltage VpOUT and negative output voltage VnOUT) indicative of the logical value according to the inputted logic signal. The differential circuit 40 includes a first transistor 41 and a second transistor 42. The first transistor 41 changes the positive output voltage VpOUT by switching in response to the positive input voltage VpIN. The second transistor 42 changes the negative output voltage VnOUT by switching in response to the negative input voltage VnIN. The first transistor 41 and the second transistor 42 complementarily switch each other such that the difference between the positive output voltage VpOUT and the negative output voltage VnOUT is corresponded to the difference between the positive input voltage VpIN and the negative input voltage VnIN.

Here, the logic of the differential logic signal is represented by the potential difference between the positive voltage and the negative voltage. When the logic is inversed, one of the differential logic signal pair is changed from high potential to low potential, and another of the differential logic signal pair is changed from low potential to high potential. Therefore, the logic of the differential logic signal is inversed at the timing at which the positive voltage is equal to the negative voltage. Additionally, the first transistor 41 and the second transistor 42 operate such that the first transistor 41 is switched from ON to OFF while the second transistor 42 is switched from OFF to ON.

Then, when the temperature is changed, the threshold value is fluctuated so that the timing at which the positive voltage is equal to the negative voltage is different and jitter is generated at the timing at which the logic of the outputted differential signal is inversed. Thus, when the logic circuit 30 has the differential circuit 40, the temperature compensation circuit 20 may detect the temperature of the first transistor 41 and the second transistor 42 as the value corresponding to the temperature of the switching element and correct the voltage of the inputted differential signal based on the temperature to reduce the difference of the switching timing due to the temperature change of the switching element. In this case, the correction section 32 may correct at least one of the positive input voltage VpIN or the negative input voltage VnIN based on the value corresponding to the temperature of the first transistor 41 or the second transistor 42.

Additionally, as for the first transistor 41 and the second transistor 42, since the current is applied and the temperature is increased when the transistor is ON state, no difference of temperature is generated provided that the length of ON time within a certain period is same, but any difference of temperature is generated provided that the length of ON time is different. Therefore, the temperature detecting section 31 may detect the ratio between the length of the ON time of the transistor 41 and that of the transistor 42 as the value corresponding to the difference of temperature between the first transistor 41 and the second transistor 42. Additionally, since the first transistor 41 and the second transistor 42 are complementally operate each other, the first transistor 41 is ON state when the second transistor is OFF state, and vice versa. Accordingly, the temperature detecting section 31 may detect the ratio of ON time within a certain time of at least one of the first transistor 41 or the second transistor 42 as the value corresponding to the difference of temperature between the first transistor 41 or the second transistor 42.

Additionally, the first transistor 41 and the second transistor 42 operate according to the logic indicated by the logic signal inputted from the previous circuit. Accordingly, the temperature detecting section 31 may detect the ratio of the ON time of at least one of the first transistor 41 or the second transistor 42 based on the positive input voltage VpIN or the negative voltage VnIN and also detect the detected ratio as the value corresponding to the temperature.

As described above, the temperature compensation circuit 20 according to the first embodiment effectively compensates the difference of the switching timing due to the temperature change of the switching element included in the differential circuit 40 in the logic circuit 30. Therefore, the temperature compensation circuit 20 according to the present embodiment can reduce jitter of the differential logic signal.

Figure 4:
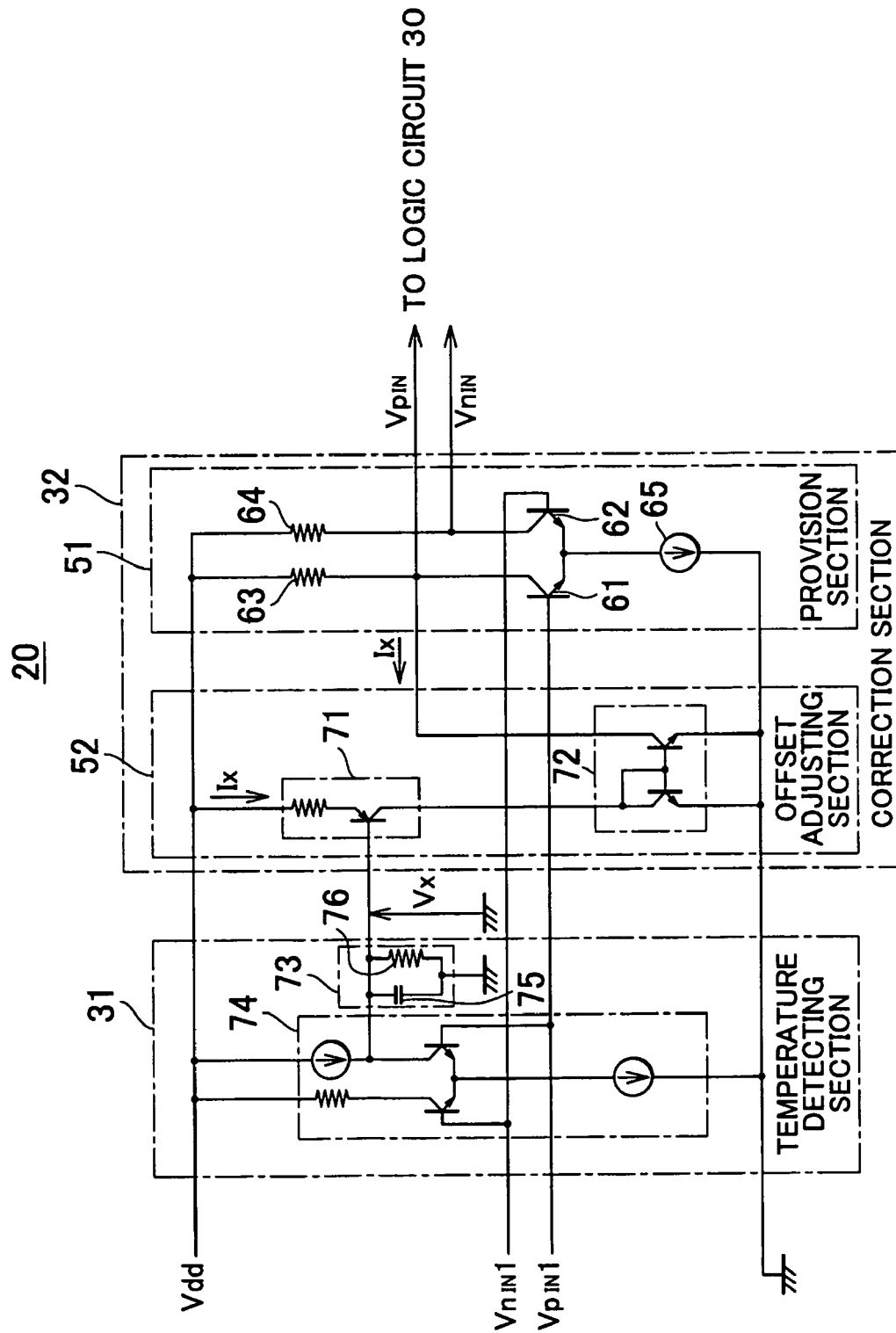
FIG. 4 shows a temperature compensation circuit 20 according to a second embodiment of the present invention.

FIG. 4 shows a temperature compensation circuit 20 according to a second embodiment. The compensation circuit 20 according to the second embodiment compensates the temperature of a logic circuit 30 including a differential circuit 40. The temperature compensation circuit 20 according to the present embodiment and the logic circuit 30 to be compensated by the temperature compensation circuit 20 includes the function and the configuration substantially same as those of the components having same reference numerals in FIG. 3, so that the description is omitted except for the difference.

A correction section 32 may include a provision section 51 and an offset adjusting section 52. The provision section 51 may input a differential signal (a positive voltage VpIN1 and a negative voltage VnIN1) outputted from the previous circuit, differential-switch the differential signal and provide the same to the differential circuit 40 in the logic circuit 30 as a positive input voltage VpIN and a negative voltage VnIN.

The provision section 51 may include a first npn transistor 61, a second npn transistor 62, a first load resistance 63, a second load resistance 64 and a first constant current source 65. In the first npn transistor 61, a collector is connected to a supply voltage Vdd via the first load resistance 63, and an emitter is connected to a current suction side of the first constant current source 65. The first npn transistor 61 inputs the positive voltage VpIN1 of the differential signal outputted from the previous circuit to the base and outputs the positive input voltage VpIN from the collector. Then, the first npn transistor 61 switches in response to the positive voltage VpIN1 to change the positive input voltage VpIN.

In the second npn transistor 62, a collector is connected to the supply voltage Vdd via the second load resistance 64, and an emitter is connected to a current suction side of the first constant current source 65. The second npn transistor 62 inputs the negative voltage VnIN1 of the differential signal outputted from the previous circuit to the base and outpus the negative input voltage VnIN from the collector. Then, the second npn transistor 62 switches in response to the negative voltage VnIN1 to change the negative input voltage VnIN.

The offset adjusting section 52 adjusts the offset voltage of at least one of the positive input voltage VpIN or the negative input voltage VnIN provided from the provision section 51 to the logic circuit 30 based on the value corresponding to the temperature. The offset adjusting section 52 may include a voltage-current conversion section 71 and a current mirror circuit 72, for example. The voltage-current conversion section 71 applies a current Ix according to a voltage Vx inputted from the temperature detecting section 31 as the value corresponding to the temperature. The current mirror circuit 72 sucks out the current same as the current Ix applied to the voltage-current conversion section 71 from the output end of the positive input voltage VpIN of the provision section 51. Therefore, the current Ix is applied to the first load resistance 63, so that the offset adjusting section 52 can adjust the value of the positive input voltage VpIN outputted from the provision section 51 to a value less than the positive input voltage VpIN when the offset adjusting section 52 is not provided by the offset voltage (Ix×Rx, where Rx is the resistance value of the first load resistance 63) [0039] Additionally, the offset adjusting section 52 reduces the current Ix when the voltage Vx is increased to reduce the offset voltage. Alternatively, the offset adjusting section 52 increases the current Ix when the voltage Vx is decreased to increase the offset voltage. Accordingly, the offset adjusting section 52 adjusts such that the positive voltage VpIN is increased when the voltage Vx is increased, and alternatively reduces the positive input voltage VpIN when the voltage Vx is decreased. Thereby the offset adjusting section 52 may control the positive input voltage VpIN to reduce the difference due to the temperature change in the differential circuit 40 included in the logic circuit 30. Here, the offset adjusting section 52 may apply the offset voltage to the negative input voltage VnIN instead of the positive input voltage VpIN.

The temperature detecting section 31 may generate the voltage Vx according to the ratio of the time at which at least one of the differential signal pair (the positive voltage VpIN1 and the negative voltage VnIN1) outputted from the previous circuit is at the high logic level H or the low logic level L, and provide the voltage Vx to the offset adjusting section 52 as the value corresponding to the temperature. The temperature detecting section 31 may include a charge accumulating section 73 and a charge/discharge section 74, for example. The charge accumulating section 73 includes a condenser 75 and a resistor 76 and generates the voltage Vx according to the amount of charge charged in the condenser 75. Here, the capacity of the condenser 75 and the resistance value of the resistor 76 are previously set to a value such that the voltage Vx is the value corresponding to the temperature of the first npn transistor 61 or the second npn transistor 62. The charge/discharge section 74 charges/discharges to/from the condenser 75 in the charge accumulating section 73 according to the logic of the differential signal outputted from the previous circuit.

For example, the charge/discharge section 74 provides a predetermined amount of current to the charge accumulating section 73 and discharges from the condenser 75 in the charge accumulating section 73 to increase the voltage Vx while the positive voltage VpIN1 of the differential signal outputted from the previous circuit is at the high logic level H, for example. The charge/discharge section 74 sucks out a predetermined amount of current from the charge accumulating section 73 and charges the condenser 75 in the charge accumulating section 73 to reduce the voltage Vx while the positive voltage VpIN1 of the differential signal is at the low logic level L. Therefore, the charge/discharge section 74 can generate the voltage Vx according to the ratio of the time of the positive voltage VpIN of the differential signal at the high logic level H, which is inputted from the previous circuit.

The temperature compensation circuit 20 according to the second embodiment can generate the voltage Vx indicative of the difference of temperature between the first transistor 41 and the second transistor 42 based on the logic signal inputted from previous circuit to the differential circuit 40 in the logic circuit 30. Additionally, the temperature compensation circuit 20 according to the present embodiment can apply the offset voltage to the voltage value of the logic signal inputted from the previous circuit to the logic circuit 30 based on the voltage Vx indicative of the value corresponding to the temperature.

Figure 5:
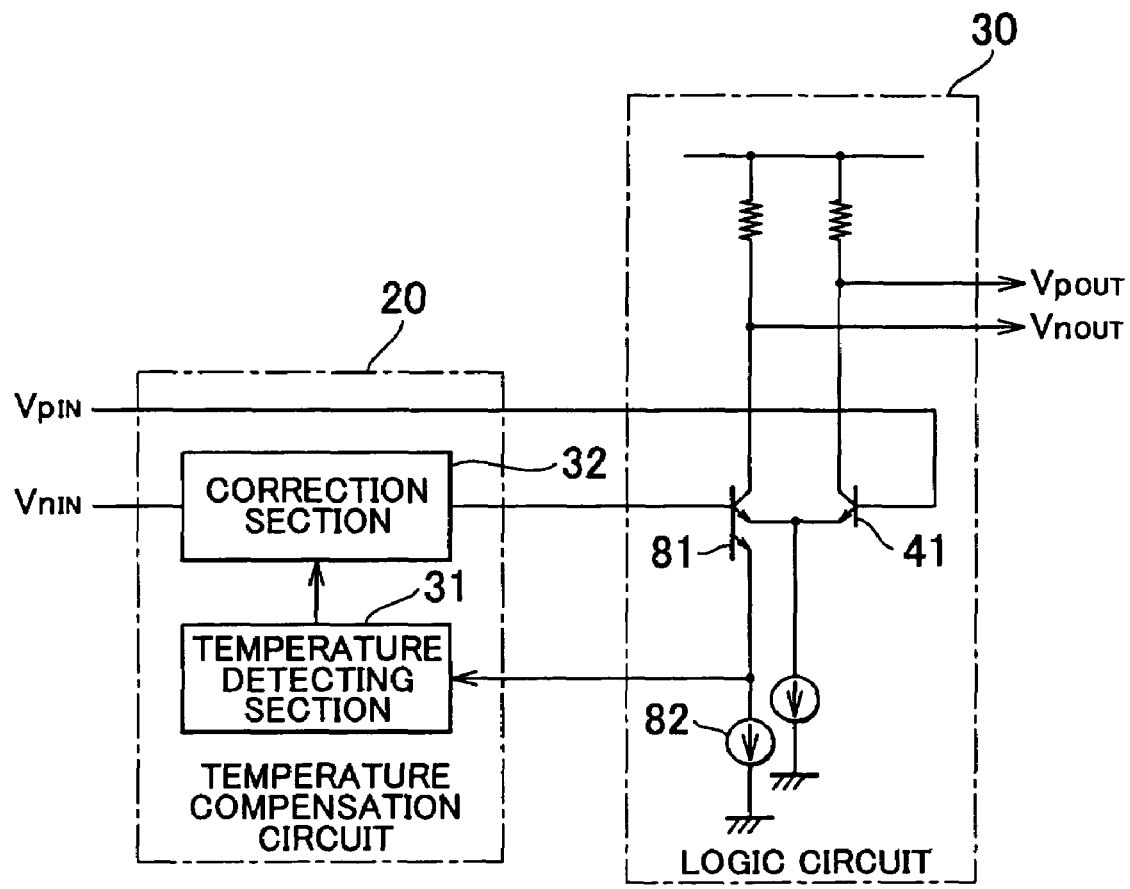
FIG. 5 shows a temperature compensation circuit 20 according to a third embodiment of the present invention along with the logic circuit 30.

FIG. 5 shows a temperature compensation circuit 20 according to a third embodiment along with the logic circuit 30. The temperature compensation circuit 20 according to the present embodiment and the logic circuit 30 to be compensated by the temperature compensation circuit 20 have the function and the configuration substantially same as those of the components with the reference numerals same as that shown in FIG. 2, so that the description is omitted except for the difference. When a switching element is a transistor, the temperature detecting section 31 may detect the voltage between the PN junction which is adjacent to the PN junction forming a base-emitter junction of the transistor as the value corresponding to the difference of temperature.

For, example, the logic circuit 30 includes a third transistor 81 as a switching element. The third transistor 81 includes a plurality of N channels provided in a P channel or a plurality of P channels provided in a N channel, so that a plurality of emitters are formed on one base. In this case, the temperature detecting section 31 may suck out the constant current from the emitter among the plurality of emitters formed in the third transistor 81, which is not used as a switching element through a second constant current source 82 and detect the voltage of the emitter terminal. Thereby when the characteristic of the PN junction forming a base-emitter junction which operates as the switching element of the third transistor 81 is fluctuated by a temperature, the temperature detecting section 31 can directly detect the fluctuation as a voltage value.

As described above, the temperature compensation circuit 20 according to the third embodiment can directly detect that the characteristic of the transistor is fluctuated by a temperature and compensate the temperature of the transistor.

Figure 6:
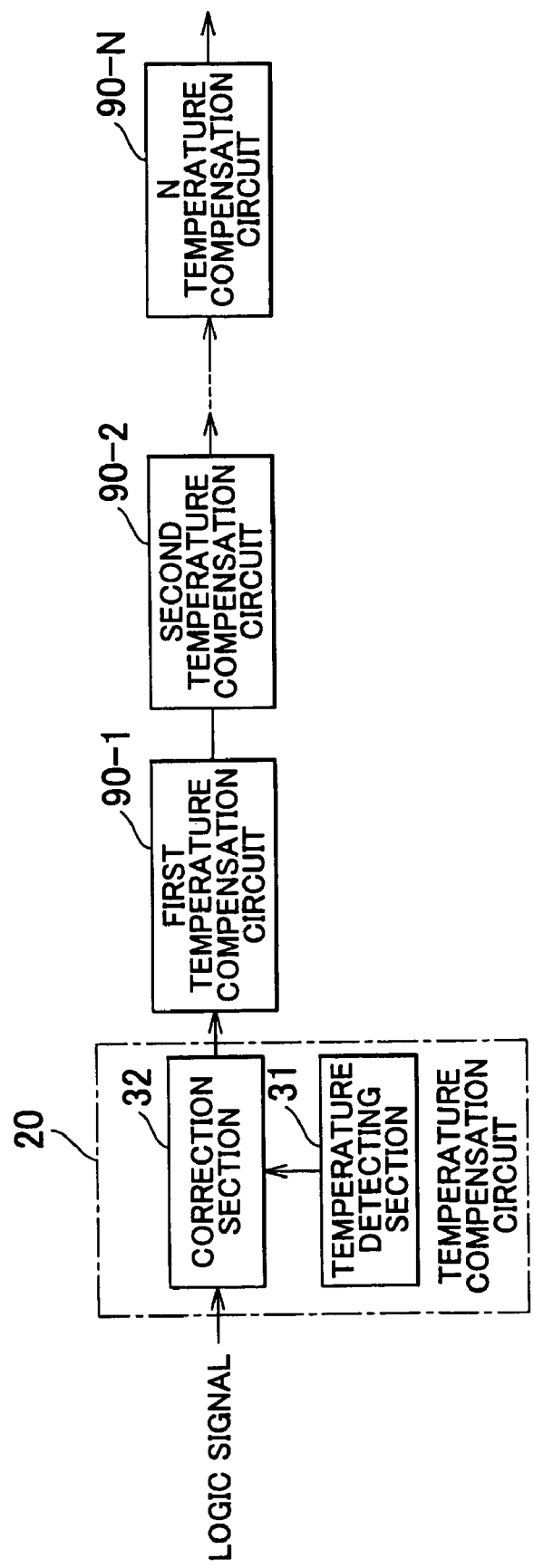
FIG. 6 shows a temperature compensation circuit 20 according to a fourth embodiment of the present invention along with a first-Nth temperature compensated circuits 90-1-90-N.

FIG. 6 shows a temperature compensation circuit 20 according to a fourth embodiment along with a first-Nth temperature compensated circuits 90-1-90-N. The temperature compensation circuit 20 according to the present embodiment and the logic circuit to be compensated by the temperature compensation circuit 20 have the function and the configuration substantially same as those of the components with the reference numerals same as that shown in FIG. 2, so that the description is omitted except for the difference. When a plurality (N) of temperature compensated circuits 90 (a first temperature compensated circuit 90-1, a second temperature compensated circuit 90-2, . . . a Nth temperature compensated circuit 90-N) which are an example of the logic circuits 30 are connected in series, the temperature compensation circuit 20 may collectively compensate the total difference of the switching timing due to the temperature change of each switching element included in the plurality of temperature compensated circuits 90-1-90-N.

In this case, the temperature detecting section 31 detects a value corresponding to the temperature of at least one of the switching element included in any of the plurality of logic circuits 30 connected in series. The correction section 32 corrects the voltage of the logic signal inputted to the front first temperature compensated circuit 90-1 in order to reduce the total difference of the switching timing due to the temperature change of the switching element for each of the plurality of logic circuit 30 connected in series.

Since the switching element for each of the plurality of the temperature compensated circuits 90-1-90-N are connected in series, each of the ratio of the time between ON/OFF is equal. Accordingly, the temperature detecting section 31 can correct the whole of the temperature compensated circuits 90 by detecting the value corresponding to the temperature of the switching element included in at least one temperature compensated circuit 90. Thereby the temperature compensated circuit 20 according to the fourth embodiment can reduce any jitter of the logic signal through the plurality of logic circuits connected in series without providing the temperature compensation circuit 20 for each of the plurality of temperature compensated circuits 90. Here, the temperature detecting section 31 according to the present embodiment may have the circuit configuration as shown in FIG. 3, FIG. 4 and FIG. 5.

While the present invention have been described with the embodiment, the technical scope of the invention not limited to the above described embodiment. It is apparent to persons skilled in the art that various alternations and improvements can be added to the above-described embodiment. It is apparent from the scope of the claims that the embodiment added such alternation or improvements can be included in the technical scope of the invention.

According to the present invention as thus described above, the difference of the switching timing due to the temperature change of the switching elements included in the logic circuit can be effectively compensated.

What is claimed is:

1. A temperature compensation circuit for compensating the difference of a switching timing due to temperature change of a switching element included in a logic circuit, comprising:
   a temperature detecting section for detecting a value corresponding to the temperature of the switching element; and
   a correction section for correcting the voltage of a logic signal inputted from a previous circuit to the logic circuit in order to reduce the difference of the switching timing due to the temperature change of the switching element based on the value corresponding to the temperature,
   wherein the logic circuit is a differential circuit having a first transistor for switching in response to a positive input voltage to change a positive out put voltage and a second transistor for switching in response to a negative input voltage to change a negative output voltage, and
   the correction section corrects at least one of the positive input voltage or the negative input voltage based on the value corresponding to the temperature.

2. The temperature compensation circuit according to claim 1, wherein the temperature detecting section detects a ratio of the ON time of at least one of the first transistor or the second transistor based on the positive input voltage or the negative input voltage and detects the detected ratio as the value corresponding to the temperature.

3. The temperature compensation circuit according to claim 1, wherein the correction section comprises:
   a provision section for inputting a differential signal outputted from the previous circuit,
   differential-switching the differential signal and providing the same as the positive input voltage and the negative input voltage to the logic circuit, and
   an offset adjusting section for adjusting at least one of the positive input voltage or the negative input voltage provided front the provision section to the logic circuit based on the value corresponding to the temperature.

4. The temperature compensation circuit according to claim 3, wherein the temperature detecting section generates a voltage according to the ratio of the time at which at least one of the differential signal pair is at a high logic level H or a low logic level L outputted from the previous circuit and provides the voltage as the value corresponding to the temperature to the offset adjusting section.

5. The temperature compensation circuit according to claim 1, wherein the switching element is a transistor, and the temperature detecting section detects the voltage across a PN junction adjacent which is the PN junction forming a base-emitter junction of the transistor.

6. The temperature compensation circuit according to claim 1,
   wherein the temperature detecting section detects the value corresponding to the temperature of the switching element included in at least one of a plurality of logic circuits connected in series, and
   the correction section corrects the voltage of the logic signal inputted to the front logic circuit in order to reduce the total difference of the switching timing due to the temperature change of the switching element for each of the plurality of logic circuits connected in series based on the value corresponding to the temperature.

7. A testing apparatus for testing a device under test, comprising:
   a test signal generating section for generating a test signal to be provided to the device under test;
   a determining section for determining pass/fail of the device under test based on an output signal outputted by the device under test according to the test signal; and
   a temperature compensation circuit for compensating the difference of a switching timing due to temperature change of a switching element included in a logic circuit in the testing apparatus,
   wherein the temperature compensation circuit comprises:
      a temperature detecting section for detecting a value corresponding to the temperature of the switching element; and
      a correction section for correcting a voltage of a logic signal inputted from a previous circuit to the logic circuit in order to reduce the difference of a switching timing due to the temperature change of the switching element based on the value corresponding to the temperature; and
   wherein the logic circuit is a differential circuit having a first transistor for switching in response to a positive input voltage to change a positive output voltage and a second transistor for switching in response to a negative input voltage to change a negative output voltage, and
      the correction section corrects at least one of the positive input voltage or the negative input voltage based on the value corresponding to the temperature.

* * * * *

UNITED STATES PATENT AND TRADEMARK OFFICE
CERTIFICATE OF CORRECTION

PATENT NO. : 7,342,407 B2
APPLICATION NO. : 11/343900
DATED : March 11, 2008
INVENTOR(S) : Yuji Kuwana et al.

Page 1 of 1

It is certified that error appears in the above-identified patent and that said Letters Patent is hereby corrected as shown below:

In the Claims:

In Claim 1, column 9, line 21, the words "out put" should be --output--.

In Claim 3, column 9, line 43, "front" should be --from--.

Signed and Sealed this

Twenty-ninth Day of July, 2008

JON W. DUDAS
*Director of the United States Patent and Trademark Office*